US012564023B2

(12) United States Patent
Sakai et al.

(10) Patent No.: US 12,564,023 B2
(45) Date of Patent: Feb. 24, 2026

(54) FREE-STANDING SUBSTRATE FOR EPITAXIAL CRYSTAL GROWTH, AND FUNCTIONAL ELEMENT

(71) Applicant: NGK INSULATORS, LTD., Nagoya (JP)

(72) Inventors: Masahiro Sakai, Nagoya (JP); Takashi Yoshino, Ama (JP)

(73) Assignee: NGK INSULATORS, LTD., Nagoya (JP)

( * ) Notice: Subject to any disclaimer, the term of this patent is extended or adjusted under 35 U.S.C. 154(b) by 497 days.

(21) Appl. No.: 18/068,830

(22) Filed: Dec. 20, 2022

(65) Prior Publication Data

US 2023/0119023 A1      Apr. 20, 2023

Related U.S. Application Data

(63) Continuation of application No. PCT/JP2021/006355, filed on Feb. 19, 2021.

(30) Foreign Application Priority Data

Jun. 29, 2020    (JP) ................................. 2020-111783

(51) Int. Cl.
| | |
|---|---|
| *C30B 29/40* | (2006.01) |
| *H01L 21/02* | (2006.01) |
| *H10H 20/825* | (2025.01) |
| *C30B 19/02* | (2006.01) |
| *C30B 25/18* | (2006.01) |

(52) U.S. Cl.
CPC ...... *H01L 21/02005* (2013.01); *C30B 29/406* (2013.01); *H10H 20/825* (2025.01); *C30B 19/02* (2013.01); *C30B 25/18* (2013.01)

(58) Field of Classification Search
CPC ..... C30B 25/18; C30B 29/403; C30B 29/406; H01L 21/02005
See application file for complete search history.

(56) References Cited

U.S. PATENT DOCUMENTS

| | | | |
|---|---|---|---|
| 7,195,545 B2 | 3/2007 | Nakayama et al. | |
| 7,229,926 B2 | 6/2007 | Matsumoto | |

(Continued)

FOREIGN PATENT DOCUMENTS

| | | |
|---|---|---|
| DE | 102013210057 A1 | 12/2014 |
| JP | 2002-356398 A | 12/2002 |

(Continued)

OTHER PUBLICATIONS

English Translation of the International Preliminary Report on Patentability, issued in corresponding International Application No. PCT/JP2021/006355, Date of Mailing Jan. 12, 2023 (6 pages).

(Continued)

*Primary Examiner* — Jaehwan Oh
(74) *Attorney, Agent, or Firm* — FLYNN THIEL, P.C.

(57)      ABSTRACT

A free-standing substrate, for growing epitaxial crystal composed of a group 13 nitride crystal selected from gallium nitride, aluminum nitride, indium nitride or a mixed crystal thereof, includes a nitrogen polar surface and group 13 element polar surface. The nitrogen polar surface is warped in a convex shape, and a chamfer part is provided in an outer peripheral part of the nitrogen polar surface.

12 Claims, 10 Drawing Sheets

(56)  References Cited

U.S. PATENT DOCUMENTS

| | | | | |
|---|---|---|---|---|
| 7,902,045 | B2 * | 3/2011 | Arena | ............... H01L 21/76254 |
| | | | | 438/459 |
| 8,728,622 | B2 | 5/2014 | Fujito et al. | |
| 2006/0255341 | A1 * | 11/2006 | Pinnington | .......... H10H 20/018 |
| | | | | 257/E33.068 |
| 2007/0176199 | A1 | 8/2007 | Shibata | |
| 2009/0127564 | A1 | 5/2009 | Irikura et al. | |
| 2010/0270649 | A1 * | 10/2010 | Ishibashi | ........... H01L 21/02021 |
| | | | | 257/E29.089 |

FOREIGN PATENT DOCUMENTS

| | | | |
|---|---|---|---|
| JP | 2004-319951 | A | 11/2004 |
| JP | 2005-136167 | A | 5/2005 |
| JP | 2006347776 | A | 12/2006 |
| JP | 4696935 | B2 | 8/2007 |
| JP | 2007-284283 | A | 11/2007 |
| JP | 2009-94230 | A | 4/2009 |
| JP | 2009-126727 | A | 6/2009 |
| JP | 201045397 | A | 2/2010 |
| JP | 2011-77508 | A | 4/2011 |
| JP | 201177100 | A | 4/2011 |
| JP | 2013-173675 | A | 9/2013 |

OTHER PUBLICATIONS

International Search Report, with English translation, issued in corresponding International Application No. PCT/JP2021/006355, date of mailing Apr. 27, 2021 (7 pages).

Written Opinion of International Searching Authority issued in corresponding International Application No. PCT/JP2021/006355, date of mailing Apr. 27, 2021 (5 pages).

German Office Action with English translation issued in corresponding German Application No. 11 2021 003 487.1 , issued Sep. 11, 2024 (12 pages).

Chinese Office Action with English translation issued in corresponding Chinese Application No. 202180043074.1 dated Dec. 9, 2025 (12 pages).

* cited by examiner

30A 31          30b          Ga surface          31
32                                                          32
30c
N surface          30a

30B 31          30b          Ga surface          31
32                                                          32
30c
N surface
30d FIG. 9A
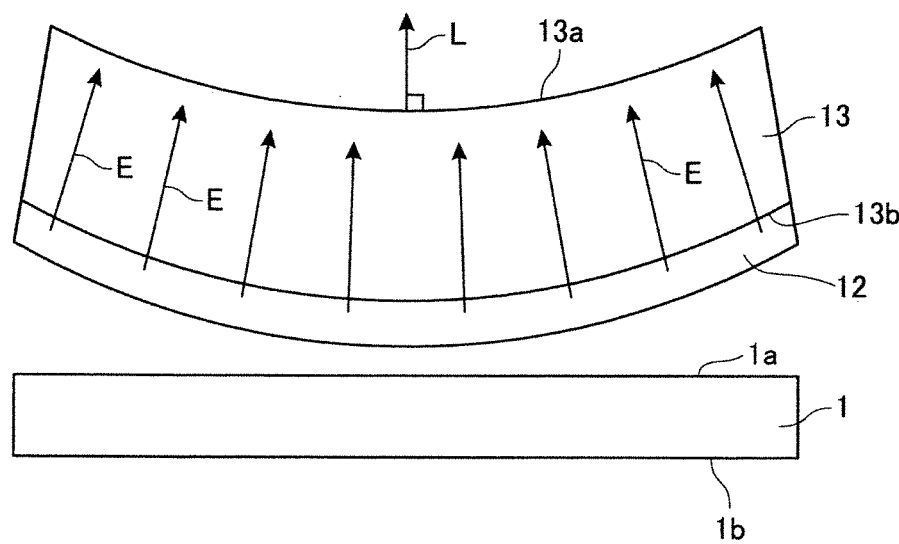
FIG. 9B
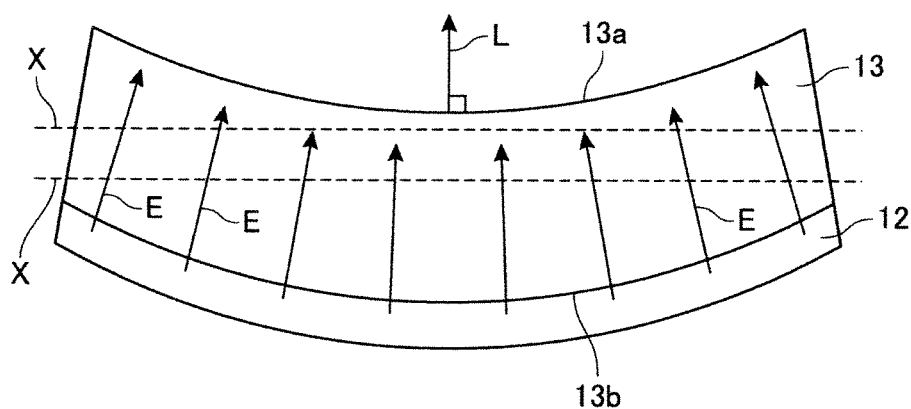
FIG. 9C

FREE-STANDING SUBSTRATE FOR EPITAXIAL CRYSTAL GROWTH, AND FUNCTIONAL ELEMENT

CROSS-REFERENCE TO RELATED APPLICATIONS

This is a continuation of PCT/JP2021/006355, filed Feb. 19, 2021, which claims priority to Japanese Application No. JP 2020-111783 filed on Jun. 29, 2020, the entire contents of which are hereby incorporated by reference.

TECHNICAL FIELD

The present invention relates to a free-standing substrate for epitaxial growth of a crystal and functional device.

BACKGROUND OF THE INVENTION

As a light-emitting device, including a monocrystalline substrate, such as a light-emitting diode (LED) or the like, it is known the device obtained by forming various kinds of gallium nitride (GaN) layers on sapphire ($\alpha$-alumina single crystal). For example, it is subjected to mass production having the structure including a sapphire substrate, GaN layer, multiple quantum-well (MQW) layers and p-type GaN layers sequentially formed, in which the multiple quantum-well layer includes InGaN layers as quantum well layers and n-type GaN layer as barrier layers. Further, it is proposed a laminated substrate suitable for such application.

It is known that a gallium nitride layer is formed on an underlying substrate composed of a sapphire substrate or the like and the underlying substrate is separated by LLO (laser lift-off method) or the like to obtain a free-standing substrate composed of gallium nitride. As a functional layer composed of GaN, AlGaN, InGaN or the like is film-formed on such free-standing substrate to produce a light emitting device such as LED or power device. Recently, in an ultra-high luminance LED or power device, it has been demanded an underlying substrate having a large size such as 4 inches or 6 inches.

However, after the gallium nitride layer is separated from the underlying substrate, the gallium nitride layer may be warped due to variation of a stress inside of gallium nitride crystal or difference of dislocation densities of the surface and bottom face of the gallium nitride layer. In such case, the variation of off-angle on the surface of the gallium nitride layer is too large, so that the function of the functional layer film-formed thereon may be deviated depending on the position. For example, in the case of the light emitting device, the variation of wavelength of the emitted light may become large depending on the position within the substrate plane.

Methods for solving such problem have been proposed and described in patent documents 1 to 3.

That is, according to patent document 1, it is tried to reduce the variation of the wavelength of emitted light, by making the group 13 element polar surface a film-formed surface (as-grown surface) and making the density of atomic steps on the growing interface substantially constant.

According to patent document 2, it is tried to reduce the variation of the wavelength of the emitted light by processing the crystal growth surface in response to the variation of the crystal axis on the crystal growth surface.

According to patent document 3, a flat plane part is provided on the central part and a curved part is provided on the outer peripheral part of the crystal growth surface of a substrate, so that the variation of off-angle on the flat plane is suppressed to reduce the variation of the off-angle of the substrate as a whole.

(Patent document 1) Japanese Patent No. 4696935B
(Patent document 2) Japanese Patent Publication No. 2009-126727A
(Patent document 3) Japanese Patent Publication No. 2009-094230A

SUMMARY OF THE INVENTION

According to the structures described in patent documents 1 to 3, the variation of the off-angle on the crystal growth surface (group 13 polar surface) of the free-standing substrate can be reduced so that it is possible to reduce the variation of wavelength of the light-emitting device. However, in a step of film-forming the functional device structure, such as light-emitting structure, on the group 13 element polar surface of the free-standing substrate, cracks may be generated in the free-standing substrate and the functional device structure.

An object of the present invention is, in a free-standing substrate for epitaxial crystal growth and composed of a group 13 nitride crystal, to prevent the generation of cracks in the substrate when the epitaxial crystal growth is performed.

The present invention provides a free-standing substrate for epitaxial crystal growth, the free-standing substrate comprising a group 13 nitride crystal selected from gallium nitride, aluminum nitride, indium nitride or a mixed crystal thereof:
  wherein the free-standing substrate comprises a nitrogen polar surface and a group 13 element polar surface;
  wherein the nitrogen polar surface is warped in a convex shape; and
  wherein the nitrogen polar surface comprises an outer peripheral part comprising a chamfer part.

The present invention further provides a functional device comprising:
  the free-standing substrate for epitaxial crystal growth; and
  a functional layer provided on the group 13 element polar surface of the free-standing substrate.

The present inventors thoroughly researched the reason that cracks are generated in the step of growing epitaxial crystal on a free-standing substrate composed of a group 13 nitride crystal selected from gallium nitride, aluminum nitride, indium nitride or a mixed crystal thereof, and reached the following findings.

That is, the functional device such as a light-emitting device or the like is film-formed on the group 13 element polar surface of the free-standing substrate. Thus, during the film-formation, the nitrogen polar surface of the free-standing substrate is mounted on a susceptor to transfer and hold the free-standing substrate. Here, for making the film-forming thickness of the functional device uniform, it is necessary to make the temperature variation on the group 13 element polar surface of the free-standing substrate uniform. For this, it has been technical prejudice that the nitrogen polar surface of the free-standing substrate is made flat.

However, the present inventors speculated as follows. In the case that the nitrogen polar surface of the free-standing substrate is made flat, micro scratches may be easily generated on the nitrogen polar surface of the free-standing substrate so as to generate the cracks, when the substrate is held or transferred with tweezers or robot arm. The present inventors thus reach the idea of chamfering the outer peripheral part of the nitrogen polar surface of the free-standing substrate.

However, even in the case that the nitrogen polar surface of the outer peripheral part of the free-standing substrate is chamfered, as the group 13 nitride crystal is hard and micro cracks or tipping may occur, so that it is difficult to completely suppress the cracks during the production steps.

Thus, the inventors have tried to chamfer the outer peripheral part of the nitrogen polar surface of the free-standing substrate as well as to provide the nitrogen polar surface with a shape of warping in a convex shape. This has been difficult to consider on the viewpoint of making thermal conduction from a susceptor to the free-standing substrate uniform, according to prior arts. However, as a result, it is found that cracks in the free-standing substrate or epitaxial crystal are considerably reduced in the case that the epitaxial crystal is film-formed on the free-standing substrate. That is, although it seems that the cracks of the substrate are suppressed when the nitrogen polar surface of the free-standing substrate has a concave shape, in fact the opposite is proved to be true.

Further, according to the present invention, as the cracks or tipping on the edge surface of the substrate and micro scratches on the bottom surface are reduced, the effect of reducing the cracks in the substrate is expected, during the epitaxial growth step of the functional layer on the free-standing substrate, as well as during the formation of devices after the film-formation of the functional layer, during thinning step by griding, lapping or polishing, during conveyance in the respective steps and during robot conveyance by means of a system equipped with an automated conveyance mechanism.

BRIEF DESCRIPTION OF THE DRAWINGS

FIG. 9A shows the state that a gallium nitride layer 13 and seed crystal film 12 are separated from the underlying substrate, FIG. 9B shows planes at which the processing of the surface and bottom surface of the gallium nitride layer 13 reaches, and FIG. 9C shows a free-standing substrate 14 whose surface and bottom surface processed.

DETAILED DESCRIPTION

Respective elements of the present invention will be further described.

The present invention provides a free-standing substrate, for epitaxial crystal growth, composed of a group 13 nitride crystal selected from gallium nitride, aluminum nitride, indium nitride or a mixed crystal thereof. The term "free-standing substrate" as used in the present invention means a substrate that are not be deformed or broken under its own weight during handling and can be handled as a solid. The free-standing substrate of the present invention can be used as a substrate for various types of semiconductor devices such as light emitting devices.

The nitride forming the group 13 nitride crystal layer is gallium nitride, aluminum nitride, indium nitride or a mixed crystal thereof. Specifically, it may be GaN, AlN, InN, $GaxAl_{1-x}N$ (1>x>0), $GaxIn_{1-x}N$ (1>x>0), $AlxIn_{1-x}N$ (1>x>0) or $GaxAlylnzN$ (1>x>0, 1>y>0, x+y+z=1) and may be further doped with an n-type dopant or p-type dopant. A preferable example of the p-type dopant may be one type or more selected from the group consisting of beryllium (Be), magnesium (Mg), strontium (Sr) and cadmium (Cd). A preferable example of the n-type dopant may be one type or more selected from the group consisting of silicon (Si), germanium (Ge), tin (Sn), and oxygen (O).

Figures 1A, 1B:
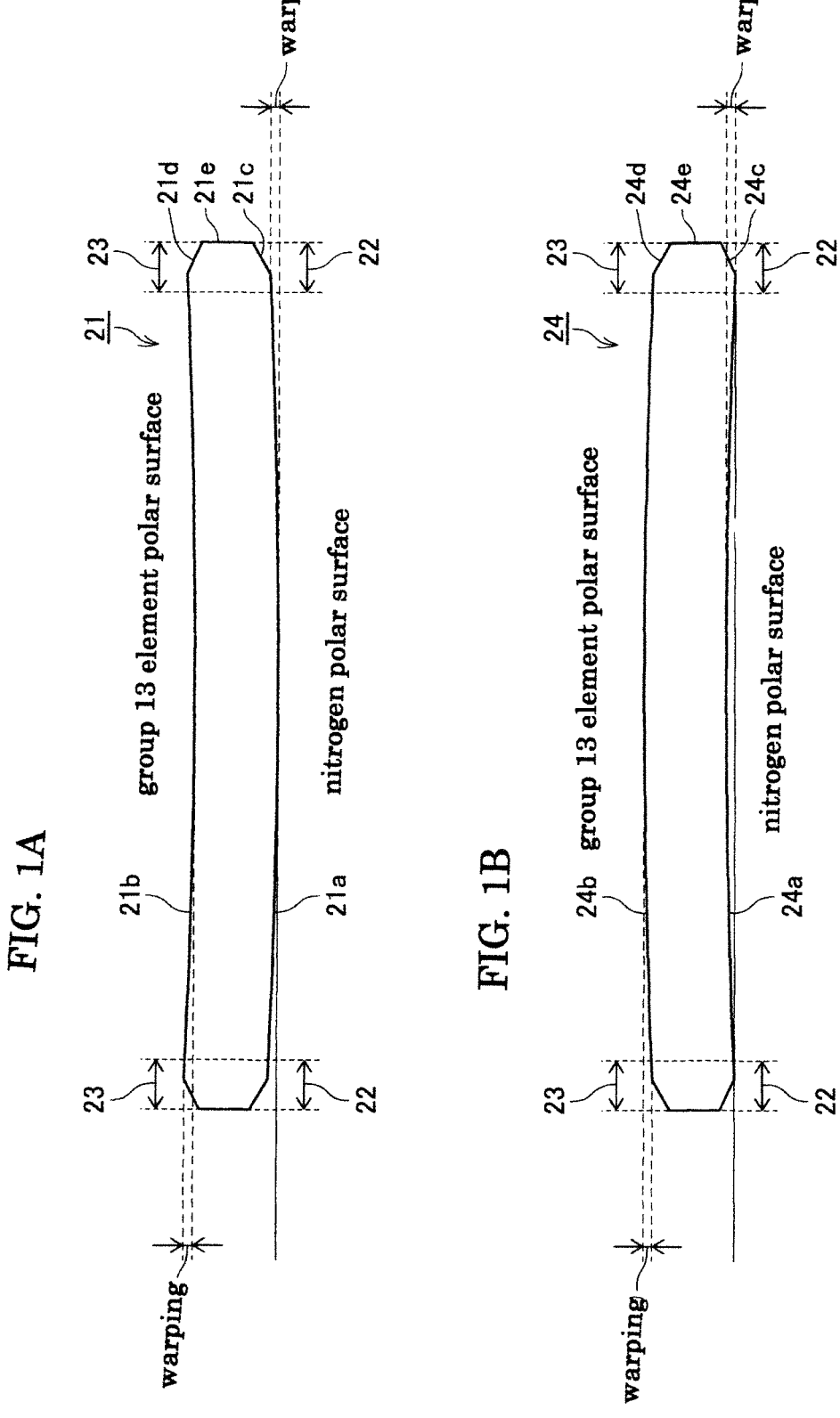
FIG. 1A is a diagram schematically showing a free-standing substrate 21 according to an embodiment of the present invention.
FIG. 1B is a diagram schematically showing a free-standing substrate 24 of a reference example.

According to the present invention, for example, as shown in FIG. 1A, a free-standing substrate 21 has a group 13 element polar surface 21b and a nitrogen polar surface 21a. Further, a side surface 21e is provided in the free-standing substrate 21. Epitaxial crystal is grown on the group 13 element polar surface 21b and the nitrogen polar surface 21a is held by a susceptor for the transportation.

Here, the nitrogen polar surface 21a of the free-standing substrate 21 is warped in a convex shape. It means that the nitrogen polar surface is warped to protrude from the free-standing substrate in the case that the free-standing substrate is viewed from the side of the nitrogen polar surface. Then, the chamfer part 21c is provided in the outer peripheral part 22 of the nitrogen polar surface 21a. Further, according to the present example, the chamfer part 21d is provided in the outer peripheral part 23 of the group 13 element polar surface 21b. Further, the group 13 element polar surface 21b is warped in a direction recessed viewed from the group 13 element polar surface of the free-standing substrate.

According to the viewpoint of the present invention, the radius of curvature of the warping of the nitrogen polar surface may preferably be +5 m or larger and +65 m or smaller, and more preferably be +7 m or larger and +32 m or smaller. Further, in the case that the nitrogen polar surface is of a convex shape, the numerical value of the radius of curvature is made a positive value (+), and in the case that the nitrogen polar surface is of a concave shape, the numerical value of the radius of curvature is made a negative value (−).

Further, the group 13 element polar surface may be warped in a convex shape with respect to the free-standing substrate, or may be warped in a concave shape with respect to the free-standing substrate, or may be flat. However, on the viewpoint of suppressing the variation of off-angle on the group 13 element polar surface, the group 13 element polar surface may preferably be warped in a different direction with respect to the direction of the convex-concave of the warping of the nitrogen polar surface, that may preferably be warped in a concave shape with respect to the free-standing substrate. It is thereby possible to reduce the variation of off-angle on the group 13 element polar surface. In this case, the radius of curvature of the warping of the group 13 element polar surface may preferably be −3 m or lower and more preferably be −7 m or lower on the viewpoint of easiness of the polishing process. Further, in the case that the group 13 element polar surface is of a convex shape, the numerical value of the radius of curvature is made a positive value (+), and in the case that the group 13 element polar surface is of a concave shape, the numerical value of the radius of curvature is made a negative value (−).

Further, according to a preferred embodiment, the absolute value of the radius of curvature of the warping of the group 13 element polar surface is made lower than the absolute value of the radius of curvature of the warping of the nitrogen polar surface. It means that the warping of the group 13 element polar surface is sharper than the warping of the nitrogen polar surface. It is thereby possible to reduce the variation of off-angle on the nitrogen polar surface. According to the present embodiment, "absolute value of radius of curvature of warping of group 13 element polar surface"/"absolute value of radius of curvature of warping of nitrogen polar surface" may preferably be 0.7 or lower and more preferably be 0.5 or lower. Further, "absolute value of radius of curvature of warping of group 13 element polar surface"/"absolute value of radius of curvature of warping of nitrogen polar surface" may generally be made 0.01 or higher.

For example, a free-standing substrate 24 shown in FIG. 1B and of a reference example has a group 13 element polar surface 24b and a nitrogen polar surface 24a. A chamfer part 24d is provided in an outer peripheral part 23 of the group 13 element polar surface 24b, and a chamfer part 24c is provided in an outer peripheral part 22 of the nitrogen polar surface 24a. The group 13 element polar surface is warped in a convex shape from the free-standing substrate and the numerical value of the radius of curvature is of a plus value. The nitrogen polar surface 24a is warped in a concave shape from the free-standing substrate and the numerical value of the radius of curvature is of a minus value. 24e represents a side surface.

Further, according to a preferred embodiment, the group 13 element polar surface is a mirror surface-finished surface. The mirror surface-finished surface means a surface of the state that roughness or waviness on the processed substrate surface is reduced so that light is reflected on the processed surface and an object can be confirmed on the processed surface by eyes, after the substrate surface is processed. That is, it means the surface state which the roughness or waviness of the substrate surface after the processing is sufficiently reduced to the degree that the roughness or waviness can be ignored with respect to the wavelength of visible light. Epitaxial crystal growth is sufficiently possible on the substrate in the case that the mirror-surface processing is performed.

Further, according to a preferred embodiment, the variation of off-angle of the group 13 element polar surface is 0.25° or lower, so that the variation of crystallinity of the epitaxial crystal can be suppressed and the variation of properties of a functional layer composed of the epitaxial crystal can be suppressed. The variation of off-angle of the group 13 element polar surface may more preferably be 0.1° or lower. Further, the variation of off-angle of the group 13 element polar surface may be 0.02° or higher in many cases.

The warping of the group 13 element polar surface or nitrogen polar surface is measured and the radius of curvature is calculated from the warping. Each warping is measured as follows.

First, the warping of the group 13 element polar surface or nitrogen polar surface can be measured by means of a laser displacement sensor. The laser displacement sensor means a system of irradiating laser light on each surface to measure displacements on each surface. The wavelength of the laser is made 655 nm, and the measurement method may be confocal method, triangulation method, or optical interference method, depending on surface roughness.

Here, as to the nitrogen polar surface, a region having a width of 3 mm from the edge of the substrate is excluded to obtain a wave form. An approximate curve with respect to the wave form is then obtained by means of least square method applying quadratic function, the differences of the maximum values and minimum values of the approximate curve are measured on two axes normal to each other on the substrate surface, and an average of the two values is specified as the warping. The radius R of curvature is calculated based on the value of the warping according to the following formula.

$$\text{Radius of curvature } R \approx (\text{diameter of substrate})2/(8\times \text{warping}) \qquad \text{Formula (1)}$$

(Here, the radius of curvature, the diameter of the substrate and warping are represented by the unit of (m).)

Further, as to the group 13 element polar surface, a region having a width of 3 mm from the edge of the substrate is excluded to obtain a wave form. An approximate curve with respect to the wave form is then obtained by means of least square method applying quadratic function, the differences of the maximum values and minimum values of the approximate curve are measured on two axes normal to each other on the substrate surface, and an average of the two values is specified as the warping. The radius R of curvature is calculated based on the value of the warping as the nitrogen polar surface.

Further, both in the cases of the nitrogen polar surface and group 13 element polar surface, the numerical value of the radius of curvature is made a positive value (+) when the least square approximation wave applying the quadratic function is of a convex shape, and the numerical value of the radius of curvature is made a negative value (−) when the least square approximation wave is of a concave shape.

Figure 2:
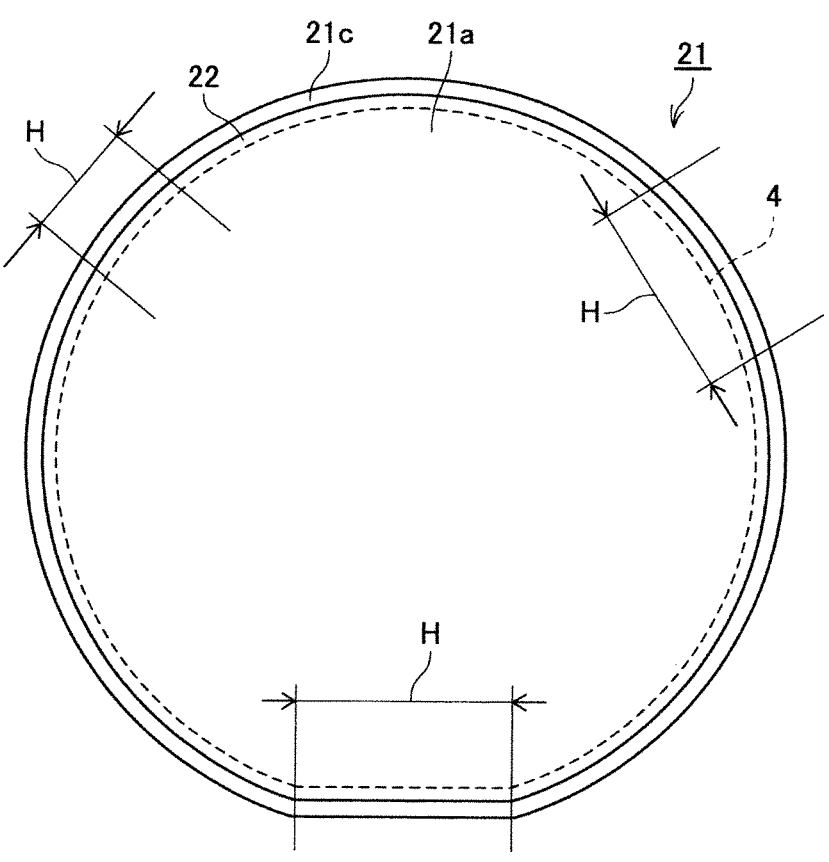
FIG. 2 shows a bottom surface of a free-standing substrate 21.

According to the present invention, a chamfer part is provided in an outer peripheral part of the nitrogen polar surface. Here, preferably, for example as shown in FIG. 2, a chamfer part 21c is provided in the outer peripheral part 22 over the whole circumference of the nitrogen polar surface 21a of the free-standing substrate 21. However, it is not necessary that the chamfer part 21c is provided over the whole circumference of the outer peripheral part of the nitrogen polar surface, and it is sufficient that the chamfer part is provided at parts which a transporting tool (tweezers, robot hand or the like) of the free-standing substrate contacts. For example, in FIG. 2, in the case that the transporting tool contacts a region H of the outer peripheral part 22 of the free-standing substrate, it is sufficient that the chamfer part 21c is provided in the region H in the outer peripheral part 22.

Further, the chamfer part may be provided over the whole width of the outer peripheral part of the nitrogen polar surface, or may be provided in only a part on the outer peripheral part. The width of the chamfer part may be larger than a width of the outer peripheral part.

Further, in the case that the chamfer part is provided in the outer peripheral part of the group 13 element polar surface, preferably, similar to the case of the nitrogen polar surface, the chamfer part 21d is provided over the whole circumference of the outer peripheral part 23 of the group 13 element polar surface 21b. However, it is not necessary that the chamfer part 21d is provided over the whole circumference of the outer peripheral part 23 of the group 13 element polar surface, and it is preferred that the chamfer part 21d is provided over 50% or more of the outer peripheral part 23 of the group 13 element polar surface.

Further, the chamfer part may be provided over the whole width of the outer peripheral part of the group 13 element polar surface, or the chamfer part may be provided in only a part of the outer peripheral part. The width of the chamfer part may be larger than the width of the outer peripheral part.

The outer peripheral part of the group 13 element polar surface means a band-shaped region having a width of lmm and including an outer edge of the group 13 element polar surface. Further, the outer peripheral part of the nitrogen polar surface means a band-shaped region having a thickness of 1 mm and including an outer edge of the nitrogen polar surface.

(Description of Shape of Chamfer Part)

FIGS. 3 and 4 further illustrate shapes of chamfer parts in the respective outer peripheral parts.

Figure 3A:
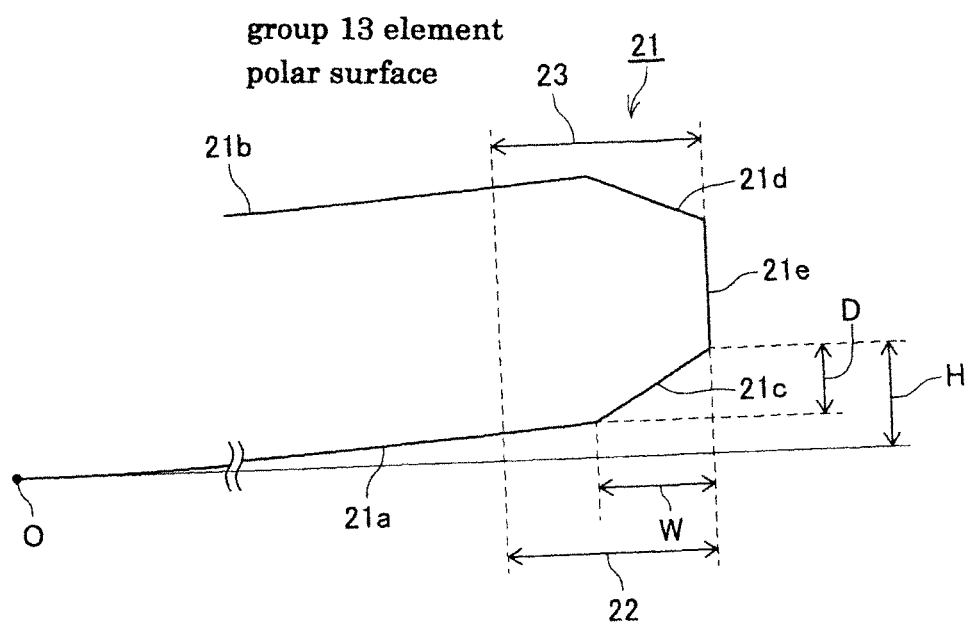
FIG. 3A is a diagram schematically showing an outer peripheral part of the free-standing substrate 21 according to an embodiment of the present invention.

According to a free-standing substrate 21 shown in FIG. 3A, a chamfer part 21c is provided in an outer peripheral part 22 of a nitrogen polar surface 21a, and chamfer part 21d is provided in an outer peripheral part 23 of a group 13 element polar surface 21b. According to the present example, each chamfer part is made a flat surface, and each of the flat surfaces is inclined with respect to the group 13 element polar surface, nitrogen polar surface and side face 21e. Further, the side face 21e is a flat surface.

Figure 3B:
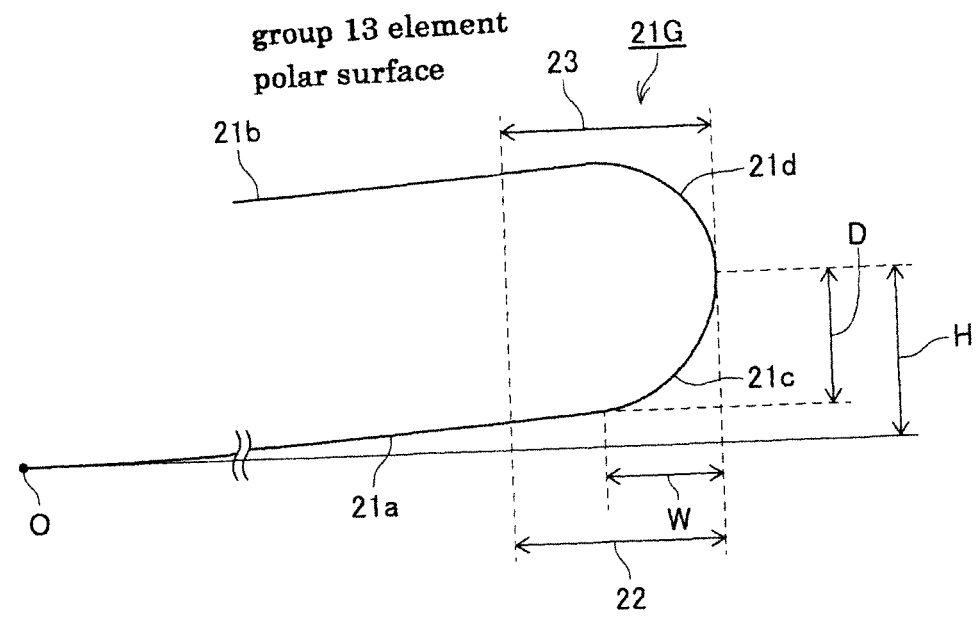
FIG. 3B is a diagram schematically showing an outer peripheral part of a free-standing substrate 21G.

According to a free-standing substrate 21G shown in FIG. 3B, a chamfer part 21c is provided in the outer peripheral part 22 of the nitrogen polar surface 21a, and chamfer part 21d is provided in the outer peripheral surface 23 of the group 13 element polar surface 21b. According to the present example, each of the chamfer parts is made a curved surface having a convex shape, the respective curved surfaces are associated with each other at the outer peripheral edge, and the flat side face is not left.

Figure 4A:
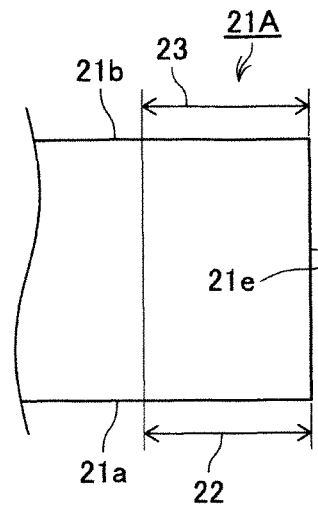
FIGS. 4A, 4B and 4C are diagrams showing outer peripheral parts of free-standing substrates 21A, 21B and 21C, respectively.

According to a free-standing substrate 21A of a reference example and shown in FIG. 4A, a chamfer part is not provided in the outer peripheral part 22 of the nitrogen polar surface 21a and in the outer peripheral part 23 of the group 13 element polar surface 21b, so that the side face 21e is flat as a whole.

Figure 4B:
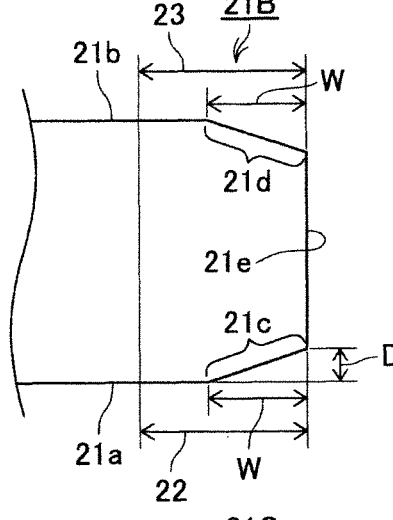

According to a free-standing substrate 21B shown in FIG. 4B, the chamfer part 21c is provided in the outer peripheral part 22 of the nitrogen polar surface 21a, and the chamfer part 21d is provided in the outer peripheral part 23 of the group 13 element polar surface 21b. The chamfer parts 21c and 21d are inclined with respect to the group 13 element polar surface, nitrogen polar surface and side face 21e. Further, the side face 21e is a flat surface.

Figure 4C:
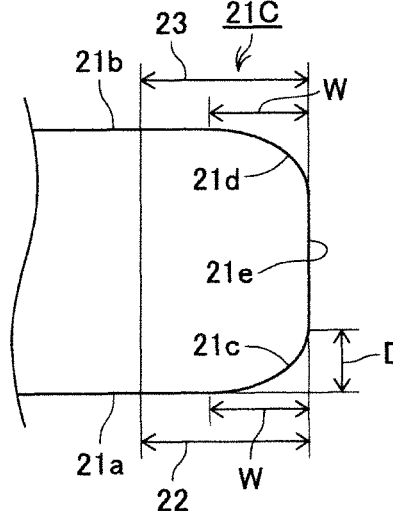

According to a free-standing substrate 21C shown in FIG. 4C, the chamfer part 21c is provided in the outer peripheral part 22 of the nitrogen polar surface 21a, and the chamfer part 21d is provided in the outer peripheral part 23 of the group 13 element polar surface 21b. According to the present example, each of the chamfer parts is made curved surface (so-called round chamfering) protruding to the outside. The side face 21e is a flat surface.

Figure 5A:
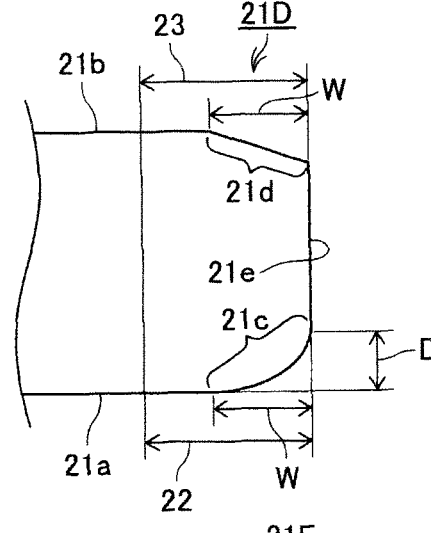
FIGS. 5A, 5B and 5C are diagrams showing outer peripheral parts of free-standing substrates 21D, 21E and 21F, respectively.

According to a free-standing substrate 21D shown in FIG. 5A, the chamfer part 21c is provided in the outer peripheral part 22 of the nitrogen polar surface 21a, and the chamfer part 21d is provided in the outer peripheral part 23 of the group 13 element polar surface 21b. According to the present example, the chamfer part 21d is a flat surface and inclined with respect to the group 13 element polar surface 21b. Further, the chamfer part 21c is made a curved surface (so-called round chamfering) protruding to the outside. The side face 21e is a flat surface.

Figure 5B:
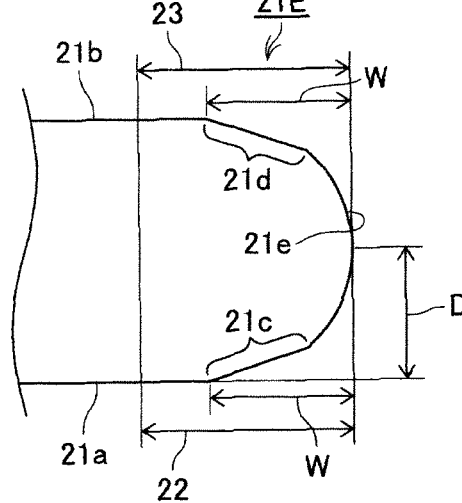

According to a free-standing substrate 21E shown in FIG. 5B, the chamfer part 21c is provided in the outer peripheral part 22 of the nitrogen polar surface 21a, and the chamfer part 21d is provided in the outer peripheral part 23 of the group 13 element polar surface 21b. According to the present example, the chamfered parts 21c and 21d are flat surfaces. Further, the side face 21e is made a curved surface protruding to the outside.

Figure 5C:
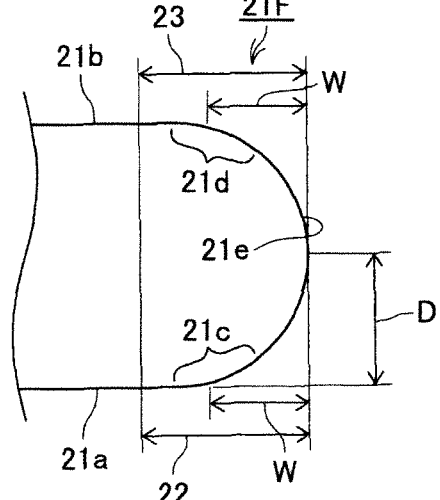

According to a free-standing substrate 21F shown in FIG. 5C, the chamfer part 21c is provided in the outer peripheral part 22 of the nitrogen polar surface 21a, and the chamfer part 21d is provided in the outer peripheral part 23 of the group 13 element polar surface 21b. According to the present example, the chamfer parts 21c and 21d are curved surfaces (so-called round chamfering surface) protruding to the outside. Further, the side face 21e is made a curved surface protruding to the outside.

According to a preferred embodiment, the nitrogen polar surface is warped in a convex shape as described above, and the group 13 element polar surface is warped in a concave shape. It is thereby possible to further suppress the variation of the off-angle on the group 13 element polarity surface. This advantage will be described further.

Figure 7A:
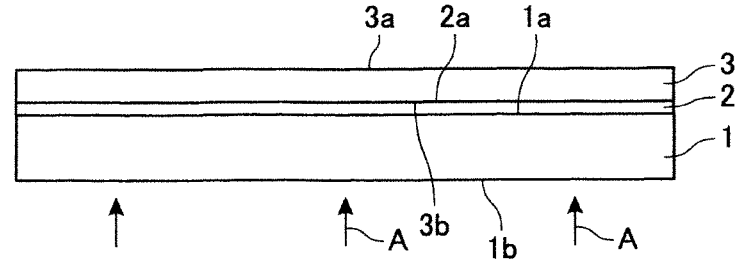
FIG. 7A shows the state that a seed crystal film 2 and a gallium nitride layer 3 are provided on an underlying substrate 1.
Figure 7B:
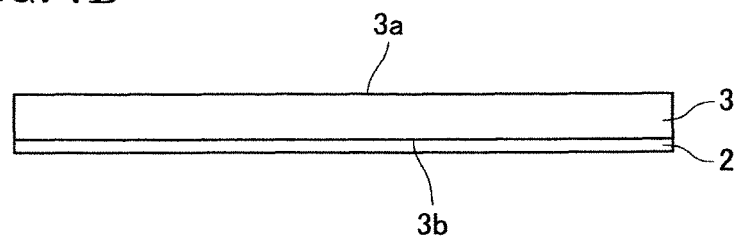
FIG. 7B shows the state that the gallium nitride layer 3 is separated from the underlying substrate.

Typically, as shown in FIG. 7A, a seed crystal film 2 is formed on a surface 1a of an underlying substrate 1, a group 13 nitride layer 3 is formed on a group 13 element polar surface 2a of the seed crystal film 2. Then, the group 13 nitride layer is separated from the underlying substrate 1 to obtain a free-standing substrate 3. The free-standing substrate may be obtained by irradiating laser light from the side of the bottom face 1b of the underlying substrate 1 as arrows A and by separating the group 13 nitride layer as shown in FIG. 7B by laser lift-off method. Alternatively, the free-standing substrate 3 may be obtained by spontaneous separation method by applying difference of thermal shrinkage during the temperature decrease after the group 13 nitride layer is formed, or by slicing the group 13 nitride by means of a wire saw or the like.

Then, the free-standing substrate is subjected to grinding process to adjust the shape into circular shape and the nitrogen polar surface of the free-standing substrate is adhered onto a surface plate. When the adhesion is performed, a load applied on the free-standing substrate is adjusted to change the thickness of wax, or a jig is interposed between the free-standing substrate and surface plate to deform the surface shape of the free-standing substrate. The group 13 element polar surface 3a is removed by processing such as grinding, lapping, polishing or the like to reduce the thickness of the substrate to a desired thickness and to flatten the surface, providing the free-standing substrate.

The group 13 element polar surface of the free-standing substrate is then adhered onto a surface plate. When the adhesion is performed, a load applied on the free-standing substrate is adjusted to change the thickness of a wax, or a jig is interposed between the free-standing substrate and surface plate to deform the surface shape of the free-standing substrate.

The nitrogen polar surface is then removed by processing, such as grinding, lapping, polishing or the like, to reduce the thickness of the substrate to a desired thickness and to flatten the surface to obtain a free-standing substrate. Here, although the nitrogen polar surface is finished after the group 13 element polar surface is finished, the order may be the opposite.

Then, the outer peripheral edge of the free-standing substrate is chamfered by grinding process so that the free-standing substrate 3A can be finally obtained.

Figure 7C:
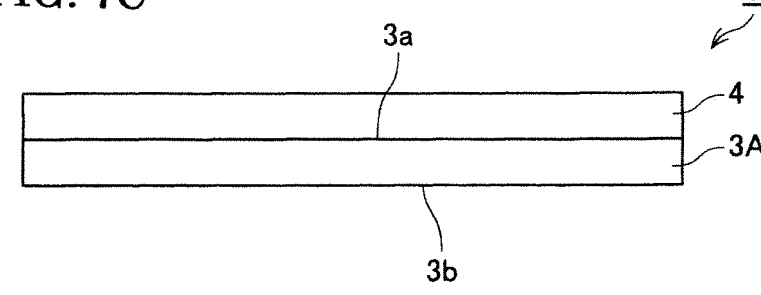
FIG. 7C shows the state that a functional layer is provided on a gallium nitride layer 3A.

Crystal is then epitaxially grown on the group 13 element polar surface 3a of the free-standing substrate 3A to form a functional layer 4 as a film as shown in FIGS. 7C and 2, so that a functional layer 5 is obtained. 3b represents a nitrogen polar surface.

Figure 8A:
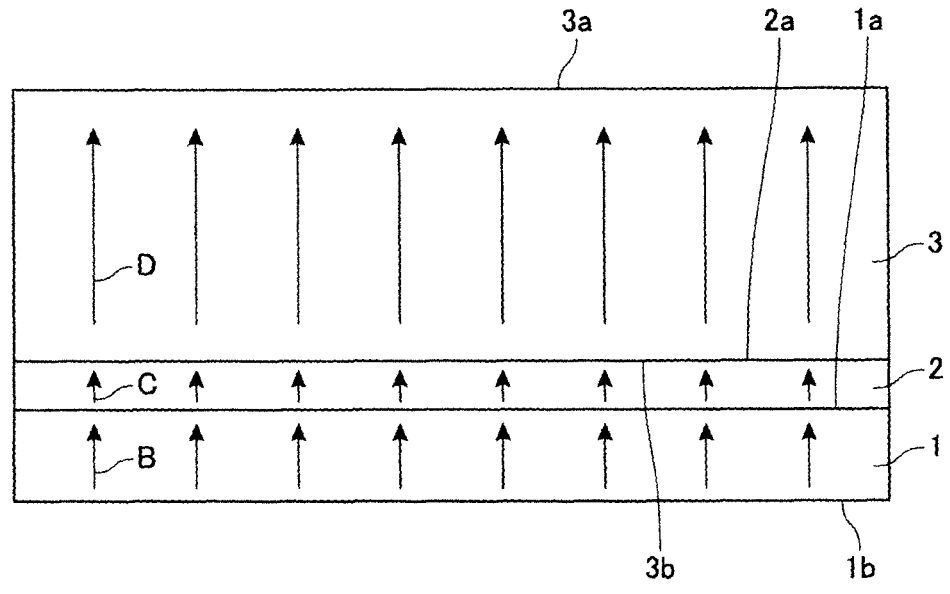
FIG. 8A shows crystal axes of the underlying substrate 1, seed crystal film 2 and gallium nitride layer 3.

Here, problems accompanied with the warping of the free-standing substrate will be described. Although it is generally applied an underlying substrate with an off-angle, in many cases, in which the crystal axis on the surface of the seed crystal film is inclined with respect to a-axis, m-axis or c-axis of wurtzite structure, it will be explained applying an underlying substrate (just substrate) having an off-angle of 0° for assisting comprehension. As shown in FIG. 8A, it is provided that the crystal axis is directed in a specific direction as shown in arrows B in the underlying substrate 1. The crystal axis B is typically a-axis, m-axis or c-axis of wurtzite structure. The crystal axes are grown in conformity with the crystal orientations of the underlying substrate as arrows C in the seed crystal film 2. Then, as the group 13 nitride layer 3 is film-formed, the crystal axis is grown in conformity with the crystal orientation of the seed crystal film as shown in arrows D.

Figure 8B:
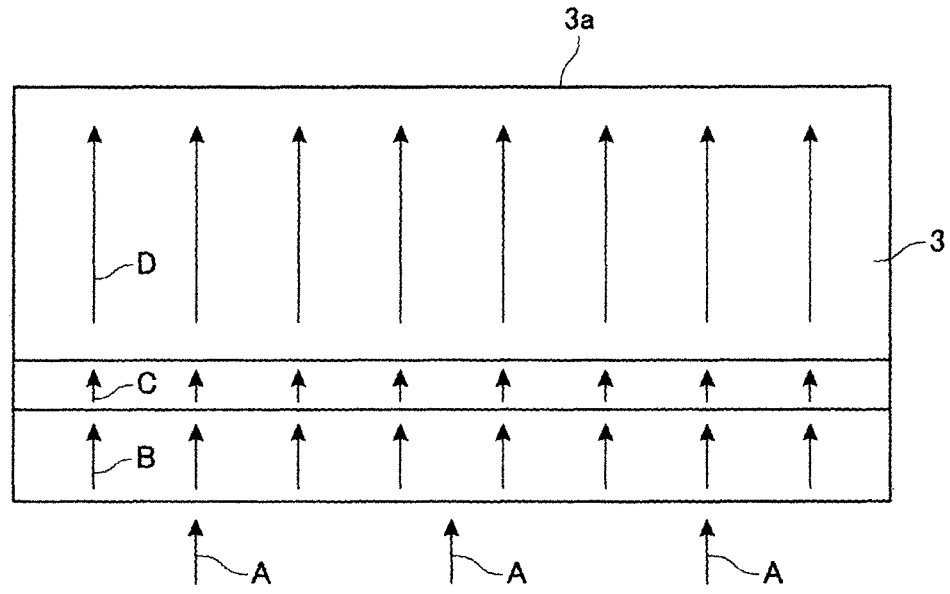
FIG. 8B shows the state that laser light A is irradiated from the side of the underlying substrate.

At this stage, laser light is irradiated as shown in arrows A so that the group 13 nitride layer is separated from the underlying substrate (FIG. 8B). Then, as schematically shown in FIG. 9A, the group 13 nitride layer 13 and seed crystal film 12 are warped. The warping is caused by, for example, internal stress due to the difference of defect densities and/or the difference of crystal growth modes between the group 13 element polar surface 13a and nitrogen polar surface 13b of the gallium nitride layer. The directions of the crystal axes E in the group 13 nitride layer 13 are changed as a whole, responsive to the warping.

For example, as shown in FIG. 9B, a pressure applied on the group 13 nitride layer is adjusted and the gallium nitride layer is adhered onto a surface plate while the shape of the warping of the gallium nitride layer is maintained at some degree. The gallium nitride layer is then subjected to grinding and polishing treatments to thin the layer so that the surface and bottom face of the substrate are conform to a pair of planes X. In this case, it is obtained a free-standing substrate 14 as shown in FIG. 9C. However, on the group 13 element polar surface 14a of the free-standing substrate 14, the off-angle of the crystal axes E are considerably changed depending on positions. Further, the off-angle on the group 13 element polar surface means an inclination angle of the crystal axis E with respect to a normal line L perpendicular to the group 13 element polar surface. As the variation of the off-angle of the group 13 element polar surface is large, as the composition or crystallinity of the functional layer epitaxially grown thereon is affected, the performance is changed depending on positions. For example, in the case that a light-emitting device is formed on the group 13 element polar surface, the wavelength of the emitted light is deviated depending on the positions, causing the reduction of a yield. Further, 14b represents the nitrogen polar surface.

Figure 10:
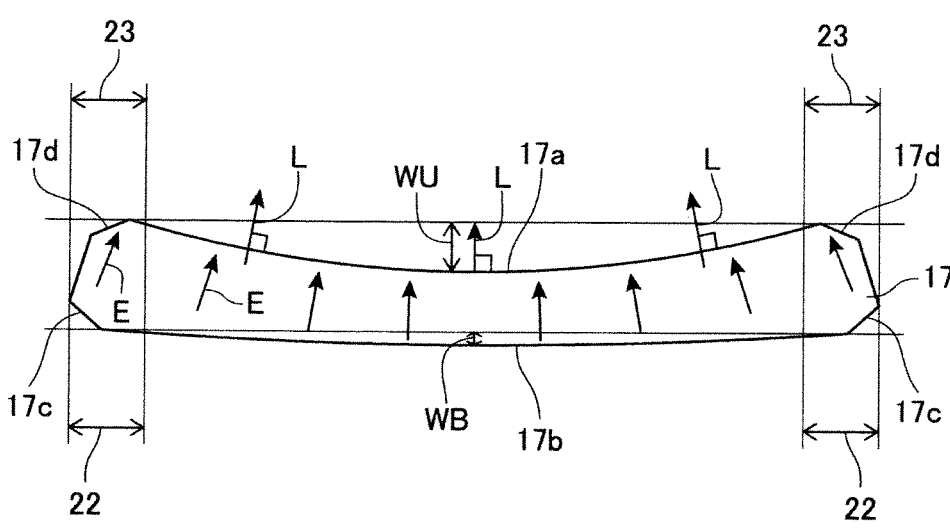
FIG. 10 is a front view schematically showing a free-standing substrate according to an embodiment of the present invention, in which the warping of the group 13 element polar surface 17a and the warping of the nitrogen polar surface 17b are different from each other.

The present inventors successfully making the performance of the functional layer, film-formed on the group 13 element polar surface, uniform further, by making the warping amount of the group 13 element polar surface of the free-standing substrate and the warping amount of the nitrogen polar surface different from each other and by reducing the variation of the off-angles on the group 13 element polar surface, even in the case that the warping is observed on the nitrogen polar surface. That is, as schematically shown in FIG. 10, for example, the warping WU of the group 13 element polar surface 17a of the free-standing substrate 17 is made relatively large, so that the variation of the off-angle on the group 13 element polar surface 17a can be reduced. At the same time, the warping of the group 13 element polar surface 17a and warping of the nitrogen polar surface 17b of the free-standing substrate 1 are different from each other. By making the warping WB of the nitrogen polar surface 17b relatively small, it is considered that the temperature variation on the group 13 element polar surface can be made small, that the variation of the composition or crystallinity of the functional layer due to this can be suppressed and that the generation of micro scratches on the nitrogen polar surface, which may be generated during the chuck and transfer of the substrate by means of tweezers or robot arm, can be suppressed. 17c and 17d represent chamfer parts, respectively.

As the warping of the group 13 element polar surface and the warping of the nitrogen polar surface are different, it is generated total thickness variation (TTV) of the self-standing substrate. However, in the case that the thickness variation of the free-standing substrate is generated, large variation is not generated on the group 13 element polar surface during epitaxial growth of the functional layer on the free-standing substrate. This is because the characteristic of high thermal conductivity of gallium nitride crystal forming the free-standing substrate is utilized. As a result, abnormal morphology during the film-formation of the functional layer is not generated and variation of wavelength of the emitted light is sufficiently suppressed.

Although the material of the underlying substrate is not particularly limited, sapphire, crystal-oriented alumina, gallium oxide, $Al_xGa_{1-x}N$ ($0 \leq x \leq 1$) and SiC are listed as preferred examples.

As the material of the seed crystal film, $Al_xGa_{1-x}N$ ($0 \leq x \leq 1$) and $In_xGa_{1-x}N$ ($0 \leq x \leq 1$) are listed as preferred examples, and gallium nitride is particularly preferred. The material of the seed crystal film is most preferably gallium nitride in which yellow luminescence effect is observed by means of a fluorescence microscope. The yellow luminescence corresponds with a peak (yellow luminescence (YL) or yellow band (YB)) observed in a range of 2.2 to 2.5 eV, in addition to transition of excitons (UV) from a band to a band.

Although the method of producing the seed crystal film is preferably a gas phase method, metal-organic chemical vapor deposition method (MOCVD: metal-organic chemical vapor deposition method), hydride vapor phase epitaxy method (HVPE), pulsed excitation deposition (PXD) method, MBE method and sublimation method are exemplified. Metal-organic chemical vapor deposition method is most preferred. Further, the growth temperature may preferably be 950 to 1200° C.

Although the direction of growth of gallium nitride crystal is not particularly limited, it may be the direction normal to c-plane of Wurtzite structure or the direction normal to a-plane or m-plane of Wurtzite structure, or normal to a plane inclined with respect to the c-plane, a-plane or m-plane.

Although the method of producing the gallium nitride layer is not particularly limited, vapor phase method such as Metal-Organic Chemical Vapor Deposition (MOCVD: Metal Organic Chemical Vapor Deposition) method, hydride vapor deposition (HVPE) method, pulse excitation deposition (PXD) method, MBE method, sublimation method or the like, and liquid phase method such as ammonothermal method, flux method or the like are exemplified.

According to a preferred embodiment, the thickness of the free-standing substrate after the polishing process may preferably be 300 μm or larger and 1000 μm or smaller.

Although the size of the free-standing substrate is not particularly limited, the size may be 2 inches, 4 inches or 6 inches and may be 8 inches or larger.

On the nitrogen polar surface and group 13 element polar surface, although the width W of the chamfer part (refer to FIGS. 3 to 5) is not particularly limited, the width W may preferably be a length of one-twenties or larger and 3 folds or smaller and more preferably be a length of one-tenth or larger and 1 fold or smaller of the thickness of the free-standing substrate, on the viewpoint of the present invention.

On the nitrogen polar surface and group 13 element polar surface, although the height D of the chamfer part (refer to FIGS. 3 to 5) is not particularly limited, the height D may preferably be a length of one-twentieth or larger and one-half or smaller, and more preferably be one-tenth or larger and two-fifth or smaller, of the thickness of the free-standing substrate in the case that the side face 21e is of a flat surface, and the height D may preferably be a length of one-twentieth or larger and a half or smaller of the thickness of the free-standing substrate in the case that the side face 21e is a curved surface, on the viewpoint of the present invention. However, the height D of the chamfer part is a dimension in the direction of thickness of the free-standing substrate from a starting point of the chamfer part to the edge of the free-standing substrate.

Further, on the nitrogen polar surface and group 13 element polar surface, the opening width H at the end of the free-standing substrate shown in FIG. 3 may preferably be 70 μm or larger and more preferably be 100 μm or larger, on the viewpoint of the present invention. Further, the opening width H may preferably be ½ or smaller and more preferably be ⅖ or smaller of the thickness of the free-standing substrate. Further, the opening width H means a height of each of the chamfer parts with respect to the center O of each of the polar surfaces 21a and 21b in the direction of thickness of the free-standing substrate.

As epitaxial crystal grown on the free-standing substrate, gallium nitride, aluminum nitride, indium nitride or mixed crystal thereof is listed. Specifically, it may be GaN, AlN, InN, $GaxAl_{1-x}N$ (1>x>0), $GaxIn_{1-x}N$ (1>x>0), $AlxIn_{1-x}N$ (1>x>0) or GaxAlyInzN (1>x>0, 1>y>0, x+y+z=1). Further, as the functional layer provided on the free-standing substrate, rectifying device layers, switching device, power semiconductor layers and the like are exemplified in addition to the light emitting layers. Further, after the functional layer is provided on the group 13 element polar surface of the free-standing substrate, the nitrogen polar surface may be subjected to processing, such as grinding or polishing treatment, to reduce the thickness of or variation of the thickness of the free-standing substrate.

EXAMPLES

Inventive Example 1

It was fabricated a free-standing substrate 21 shown in FIG. 1A and FIG. 3A.

Specifically, a seed crystal film composed of gallium nitride is provided on an underlying substrate composed of sapphire to provide a GaN template (having a substrate size of 2.5 inches). The thickness of the seed crystal film was made 2 μm.

A gallium nitride layer having a thickness of 1 mm was then formed by Na flux method. Then, the gallium nitride layer was separated by laser lift-off method to obtain a gallium nitride substrate having a thickness of 1mm. At this time, warping was observed in the gallium nitride substrate.

Then, after the outer periphery of the gallium nitride substrate was subjected to grinding treatment into a circular shape having a diameter of 2 inches, the substrate was then subjected to grinding, lapping and polishing to obtain a free-standing substrate having a thickness of 400 μm with the group 13 element polar surface and nitrogen polar surface mirror surface-finished. At this time, loads for adhesion onto a surface plate and amounts of wax used for the adhesion were changed so that the warping values of the gallium polar surface and nitrogen polar surface were adjusted in ranges shown in table 1. Further, 10 samples were prepared and the warping was shown as a numerical range of the maximum value and minimum value.

Further, chamfer parts were formed in the respective outer peripheral parts of the nitrogen polar surface and gallium polar surface. The width W of the chamfer part was made 200 μm, the opening width H of the chamfer part was made 100 μm, and the shape of the chamfer part was made a flat surface as shown in FIG. 4B. Further, the height D of the chamfer part was shown as a numerical range of the maximum value and minimum value shown in table 1.

The variation of the off-angle on the gallium polar surface of the thus obtained free-standing substrate was evaluated. Then, LED device structure was grown as an epitaxial film on the gallium polar surface of the free-standing substrate by MOCVD method, and the performances (surface morphology and wavelength of emitted light) of the LED device structure were evaluated. The results of the evaluation were shown in table 1.

The evaluation was made according to the following methods.

(Warping)

The warping values of the gallium polar surface and nitrogen polar surface of the free-standing substrate were measured as described above to calculate the radiuses of curvature.

(Method of Measuring Variation of Off Angle)

It was measured at five points on the substrate surface by means of an energy dispersive type X-ray diffraction system ("D2 CRYSO" supplied by Bruker AXS Co. Ltd.). The five points include the center of the substrate and four points positioned inside of the substrate edge by 5 mm on X-axis and Y-axis with respect to the center of the substrate as the origin. "Maximum value–minimum value" is defined as the variation of the off angle.

For example, in the case of the free-standing substrate having a diameter of 50.8 mm, the measurement is performed at five points of coordinates of (0, 0), (45.8, 0), (−45.8, 0), (0, 45.8) and (0, −45.8).

(Morphology of Epitaxial Film on Wafer Surface)

Further, the surface morphology of the thus obtained epitaxial film was observed to confirm the presence or absence of generation of abnormal parts.

(Method of Measuring Variation of Wavelength of Emitted Light of LED)

The peak wavelengths of the emitted light at the five points as the measurement of the off-angle were measured by PL (photoluminescence) measurement. "Maximum wavelength–Minimum wavelength" is defined as the variation of wavelength of the emitted light.

(Presence or Absence of Cracks)

The epitaxial films were formed on 10 free-standing substrates as described above, and the presence or absence of the cracks in the free-standing substrate and epitaxial film was observed to measure the ratio of incidence of the cracks.

surface and radius of curvature of the gallium polar surface were shown in table 1, the nitrogen polar surface was warped in a convex shape and gallium polar surface was warped in a concave shape. As a result, the morphology abnormal parts were not observed in the epitaxial film, the variation of the wavelength of the emitted light of LED was relatively small, and the yield of the free-standing substrate without the cracks was proved to be 100%.

Comparative Examples 1 to 3

The free-standing substrates and LED device structures of the respective examples were fabricated as the inventive example 1 and subjected to the evaluation. The results were shown in table 2.

That is, according to the comparative examples 1 to 3, the chamfer parts were not provided in the outer peripheral parts of the gallium polar surface and nitrogen polar surface, respectively, and the nitrogen polar surface is warped in a convex shape. As a result, the abnormal morphology parts

TABLE 1

|  | Inventive Example 1 | Inventive Example 2 | Inventive Example 3 | Inventive Example 4 |
|---|---|---|---|---|
| Chamfer part in outer peripheral part of nitrogen polarity surface | Present | Present | Present | Present |
| Chamfer part in outer peripheral part of gallium polarity surface | Present | Present | Present | Present |
| Height of chamfer part [μm] | 87 to 93 | 90 to 95 | 77 to 83 | 47 to 53 |
| Radius of curvature of nitrogen polarity surface [m] | 24.8 to 46.1 | 32.3 to 64.5 | 14.0 to 19.0 | 6.1 to 6.9 |
| Radius of curvature of gallium polarity surface [m] | −46.1 to −24.8 | −26.9 to −17.9 | −8.7 to −7.5 | −3.4 to −3.1 |
| Presence or Absence of in-plane abnormal morphology parts in epitaxial film | Absent | Absent | Absent | Absent |
| Distribution of wavelength of emitted light of LED [nm] | 12 | 10 | 8 | 6 |
| Yield of no cracks in 10 test samples (%) | 100 | 100 | 100 | 100 |

As shown in table 1, according to the inventive example 1, the chamfer parts were provided in the outer peripheral parts of the gallium polar surface and nitrogen polar surface, respectively, the radius of curvature of the nitrogen polar surface was in a range of +24.8 to 46.1 m, and the radius of curvature of the gallium polar surface was in a range of −46.1 to −24.8 m. As a result, the abnormal morphology parts were not observed in the epitaxial film, the variation of wavelength of the emitted light of LED was 12 nm, and the yield of the free-standing substrate without the cracks was proved to be 100%.

Inventive Examples 2 to 4

The free-standing substrates and LED structures were fabricated according to the same procedure as that of the inventive example 1, and subjected to evaluation. The results were shown in table 1.

That is, according to the inventive examples 2 to 4, the chamfer parts were provided in the outer peripheral parts of the gallium polar surface and nitrogen polar surface, respectively. As the radius of curvature of the nitrogen polar were not observed in the epitaxial film, the variation of wavelength of the emitted light of LED was relatively low, and the yield of the free-standing substrate without cracks was proved to be as low as 70%.

Comparative Examples 4 and 5

The free-standing substrates and LED structures of the respective examples were fabricated according to the same procedure as that of the inventive example 1 and then subjected to the evaluation. The results were shown in table 2.

That is, according to the comparative examples 4 and 5, the chamfer parts are provided in the outer peripheral parts of the gallium polar surface and nitrogen polar surface, respectively, and the nitrogen polar surface is warped in a concave shape. As a result, the abnormal morphology parts were not observed in the epitaxial film, the variation of wavelength of the emitted light of LED was relatively low, and the yield of the free-standing substrate without the cracks was considerably lowered to 50%.

TABLE 2

|  | Comparative example 1 | Comparative example 2 | Comparative example 3 | Comparative example 4 | Comparative example 5 |
|---|---|---|---|---|---|
| Chamfer part in outer peripheral part of nitrogen polarity surface | Absent | Absent | Absent | Present | Present |

TABLE 2-continued

|  | Comparative example 1 | Comparative example 2 | Comparative example 3 | Comparative example 4 | Comparative example 5 |
|---|---|---|---|---|---|
| Chamfer part in outer peripheral part of gallium polarity surface | Absent | Absent | Absent | Present | Present |
| Height of chamfer part [μm] | — | — | — | 93 to 87 | 83 to 77 |
| Radius of curvature of nitrogen polarity surface [m] | 24.8 to 46.1 | 24.8 to 46.1 | 6.1 to 6.9 | −46.1 to −24.8 | −19.0 to −14.0 |
| Radius of curvature of gallium polarity surface [m] | −46.1 to −24.8 | −19.0 to −14.0 | −3.4 to −3.1 | 24.8 to 46.1 | 24.8 to 46.1 |
| Presence or Absence of in-plane abnormal morphology parts in epitaxial film | Absent | Absent | Absent | Absent | Absent |
| Distribution of wavelength of emitted light of LED [nm] | 12 | 11 | 7 | 12 | 13 |
| Yield of no cracks in 10 test samples (%) | 70 | 70 | 70 | 50 | 50 |

Comparative Examples 6 and 7

The free-standing substrates and LED structures of the respective examples were fabricated according to the same procedure as that of the inventive example 1 and subjected to the evaluation. The results were shown in table 3.

Further, according to the comparative examples 6 and 7, the chamfer parts were not provided in the outer peripheral parts of the gallium polar surface and nitrogen polar surface, respectively, and the nitrogen polar surface is warped in a concave shape. As a result, the abnormal morphology parts were not observed in the epitaxial film, the variation of wavelength of the emitted light of LED was relatively low, and the yield of the free-standing substrate without the cracks was considerably lowered to 30%.

procedure as that of the inventive example 1 and subjected to the evaluation. The results were shown in table 3.

Further, according to the comparative examples 8 and 10, the chamfer parts were provided in the outer peripheral parts of the gallium polar surface and nitrogen polar surface, respectively, and the nitrogen polar surface was flat. As a result, the abnormal morphology parts were not observed in the epitaxial film, the variation of wavelength of the emitted light of LED was relatively low and the yield of the free-standing substrate without the cracks was considerably reduced.

According to the comparative example 9, the chamfer parts were not provided in the outer peripheral parts of the

TABLE 3

|  | Comparative Example 6 | Comparative Example 7 | Comparative Example 8 | Comparative Example 9 |
|---|---|---|---|---|
| Chamfer Part in outer peripheral part of nitrogen polarity surface | Absent | Absent | Present | Absent |
| Chamfer part in outer peripheral part of gallium polarity surface | Absent | Absent | Present | Absent |
| Height of chamfer part [μm] | — | — | 100 | — |
| Radius of curvature of nitrogen polarity surface [m] | −46.1 to −24.8 | −19.0 to −14.0 | flat surface | |
| Radius of curvature of gallium polarity surface [m] | 24.8 to 46.1 | 24.8 to 46.1 | flat surface | |
| Presence or Absence of in-plane abnormal morphology parts in epitaxial film | Absent | Absent | Absent | Absent |
| Distribution of wavelength of emitted light of LED [nm] | 13 | 12 | 14 | 14 |
| Yield of no cracks in 10 test samples (%) | 30 | 30 | 70 | 40 |

|  | Comparative Example 10 | Comparative Example 11 | Comparative Example 12 |
|---|---|---|---|
| Chamfer Part in outer peripheral part of nitrogen polarity surface | Present | Absent | Absent |
| Chamfer part in outer peripheral part of gallium polarity surface | Present | Absent | Absent |
| Height of chamfer part [μm] | 100 | — | — |
| Radius of curvature of nitrogen polarity surface[m] | | flat surface | 24.8 to 46.1 |
| Radius of curvature of gallium polarity surface[m] | −46.1 to −24.8 | Difference of maximum heights is 17 to 23 um | Difference of maximum heights is 17 to 23 um |
| Presence or Absence of in-plane abnormal morphology parts in epitaxial film | Absent | abnormal morphology parts present in convex parts | abnormal morphology parts present in convex parts |
| Distribution of wavelength of emitted light of LED [nm] | 13 | 22 | 24 |
| Yield of no cracks in 10 test samples (%) | 70 | 40 | 70 |

Comparative Examples 8 to 10

The free-standing substrates and LED structures of the respective examples were fabricated according to the same gallium polar surface and nitrogen polar surface. Further, the nitrogen polar surface was flat. As a result, although the abnormal morphology parts were not observed in the epitaxial film and variation of the wavelength of the emitted light of LED was relatively low, the yield of the free-standing substrate without the cracks was considerably lowered.

Comparative Example 11

The free-standing substrate and LED structure were fabricated according to the same procedure as that of the inventive example 1, and subjected to the evaluation. The results were shown in table 3.

Figure 6A:
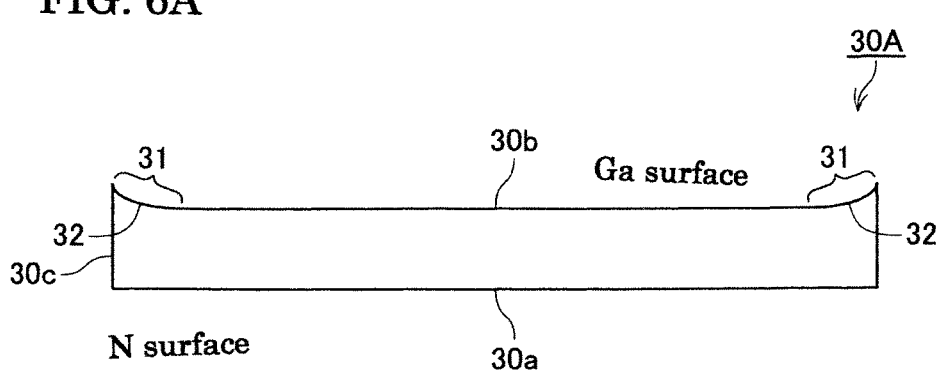
FIGS. 6A and 6B are diagrams schematically showing free-standing substrates 30A and 30B of comparative examples, respectively.

Further, the free-standing substrate 30A having the shape shown in FIG. 6A was fabricated as the free-standing substrate. This is substantially same as the free-standing substrate described in patent document 3. That is, although the nitrogen polar surface 30a of the free-standing substrate 30A of FIG. 6A was flat, the gallium polar surface 30b was flat and a recessed curved surface 32 was provided in the outer peripheral part 31 (width of 5 mm) of the gallium polar surface 30b. The side surfaces 30c of the free-standing substrate were flat. The chamfer parts were not provided.

As a result, the abnormal morphology parts of the epitaxial film were observed mainly in protruded parts on the outer peripheral part, the variation of wavelength of the emitted light of LED was particularly large in the curved part in the outer peripheral part and the yield of the free-standing substrate without the cracks was considerably lowered.

Comparative Example 12

The free-standing substrate and LED structure were fabricated according to the same procedure as that of the inventive example 1 and subjected to the evaluation. The results were shown in table 3.

Figure 6B:
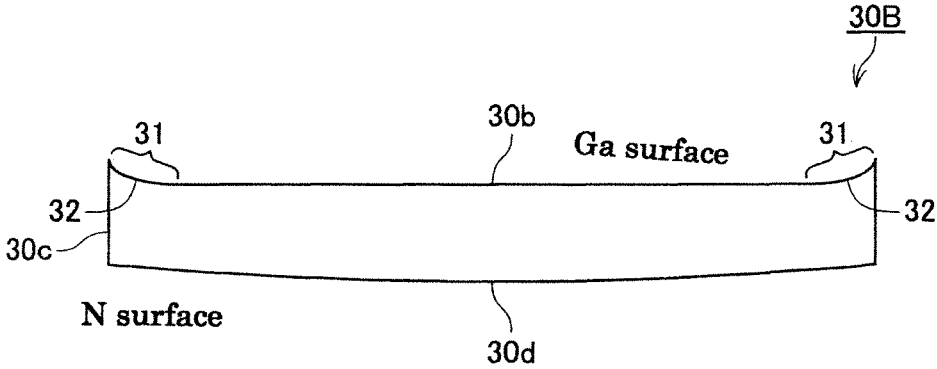

Further, as the free-standing substrate, the free-standing substrate 30B having the shape shown in FIG. 6B was fabricated. That is, although the side surface 30c of the free-standing substrate 30B was flat and the gallium polar surface 30b was flat, a recessed curved part 32 was provided in the outer peripheral part 31 (width of 3 mm) of the gallium polar surface 30b. Further, the nitrogen polar surface 30d was warped in a convex shape and the radius of curvature was in a range of +24.8 to 46.1 m. The chamfer part was not provided.

As a result, the abnormal morphology parts of the epitaxial film were observed mainly in the protruded part of the outer peripheral part of the epitaxial film, the variation of wavelength of the emitted light of LED was considerably larger in the curved part of the outer peripheral part, and the yield of the free-standing substrate without the cracks was considerably reduced.

The invention claimed is:

1. A free-standing substrate for epitaxial crystal growth, said free-standing substrate comprising a group 13 nitride crystal selected from gallium nitride, aluminum nitride, indium nitride or a mixed crystal thereof:
   wherein said free-standing substrate comprises a nitrogen polar surface and a group 13 element polar surface;
   wherein said nitrogen polar surface is warped in a convex shape; and
   wherein said nitrogen polar surface comprises an outer peripheral part comprising a chamfer part.

2. The free-standing substrate for epitaxial crystal growth of claim 1, wherein said nitrogen polar surface is warped in a curvature radius of +5 m or larger and +65 m or smaller.

3. The free-standing substrate for epitaxial crystal growth of claim 1, wherein said chamfer part is provided over the whole circumference of said outer peripheral part of said nitrogen polar surface.

4. The free-standing substrate for epitaxial crystal growth of claim 1, wherein said group 13 element polar surface comprises an outer peripheral part comprising a chamfer part.

5. The free-standing substrate for epitaxial crystal growth of claim 1, wherein said group 13 element polar surface is warped in a concave shape.

6. The free-standing substrate for epitaxial crystal growth of claim 1, wherein an absolute value of a curvature radius of warping of said group 13 element polar surface is smaller than an absolute value of a curvature radius of warping of said nitrogen polar surface.

7. The free-standing substrate for epitaxial crystal growth of claim 1, wherein said group 13 element polar surface has a variation of an off angle of 0.25° or smaller.

8. The free-standing substrate for epitaxial crystal growth of claim 1, wherein said group 13 element polar surface comprises a mirror-finished surface.

9. The free-standing substrate for epitaxial crystal growth of claim 1, wherein an aperture width at an end of said nitrogen polar surface of said free-standing substrate is 70 μm or larger and not larger than ½ of a thickness of said free-standing substrate.

10. The free-standing substrate for epitaxial crystal growth of claim 1, wherein a height of said chamfer part at said outer peripheral part of said nitrogen polar surface of said free-standing substrate is 1/20 or larger and ½ or smaller of a thickness of said free-standing substrate.

11. A functional device comprising:
   the free-standing substrate for epitaxial crystal growth of claim 1; and
   a functional layer provided on said group 13 element polar surface of said free-standing substrate.

12. The functional device of claim 11, having a light emitting function.

* * * * *